(12) United States Patent
Wei

(10) Patent No.: US 12,587,147 B2
(45) Date of Patent: Mar. 24, 2026

(54) AMPLIFYING CIRCUIT AND CHARGING METHOD WHICH CAN IMPROVE ABNORMAL SOUND

(71) Applicant: Realtek Semiconductor Corp., HsinChu (TW)

(72) Inventor: Tzu-Chieh Wei, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 441 days.

(21) Appl. No.: 18/125,133

(22) Filed: Mar. 23, 2023

(65) Prior Publication Data

US 2023/0308058 A1    Sep. 28, 2023

(30) Foreign Application Priority Data

Mar. 24, 2022    (TW) .................................. 111111126

(51) Int. Cl.
H03F 1/02        (2006.01)
H03F 3/185        (2006.01)

(52) U.S. Cl.
CPC ........... H03F 3/185 (2013.01); H03F 1/0216 (2013.01); H03F 2200/03 (2013.01)

(58) Field of Classification Search
CPC .... H03F 3/185; H03F 1/0216; H03F 2200/03; H03F 1/0277; H03F 3/68
USPC ........................................... 330/277, 255, 51
See application file for complete search history.

(56) References Cited

U.S. PATENT DOCUMENTS 7,224,218 B1 *    5/2007    Jiang .................... H03K 17/165
327/132

* cited by examiner

*Primary Examiner* — Hieu P Nguyen
(74) *Attorney, Agent, or Firm* — Winston Hsu

(57)        ABSTRACT

An amplifying circuit, comprising: a charging circuit, comprising a plurality of first transistors electrically coupled to a target device; and an output circuit, comprising a plurality of second transistors electrically coupled to the target device. After at least one of the first transistors turns on and the second transistors turn off such that the charging circuit charges the target device to a predetermined voltage, at least one of the first transistors and at least one of the second transistors simultaneously turn on for a predetermined time, and then at least one of the second transistors turns on but the first transistors turns off.

12 Claims, 7 Drawing Sheets

AMPLIFYING CIRCUIT AND CHARGING METHOD WHICH CAN IMPROVE ABNORMAL SOUND

BACKGROUND OF THE INVENTION

1. Field of the Invention

The present invention relates to an amplifying circuit and a charging method, and particularly relates to an amplifying circuit and a charging method which can avoid unlocking.

2. Description of the Prior Art

In prior art, the amplifying circuit which provides necessary voltages to a speaker always comprises a plurality of transistors. For the smooth operations of the speaker, these transistors alternately turn on (i.e., to be conducted) in different states. However, all transistors may turn off simultaneously while the circuit is switching between different states. Such issue is called "unlocking". "Unlocking" may cause the speaker to generate abnormal sounds, thus affects user experience.

SUMMARY OF THE INVENTION

One objective of the present invention is to provide an amplifying circuit which can avoid unlocking.

Another objective of the present invention is to provide a charging method which can avoid unlocking.

One embodiment of the present invention discloses an amplifying circuit, comprising: a charging circuit, comprising a plurality of first transistors electrically coupled to a target device; and an output circuit, comprising a plurality of second transistors electrically coupled to the target device. After at least one of the first transistors turns on and the second transistors turn off such that the charging circuit charges the target device to a predetermined voltage, at least one of the first transistors and at least one of the second transistors simultaneously turn on for a predetermined time, and then at least one of the second transistors turns on but the first transistors turns off.

Another embodiment of the present invention discloses a charging method, applied to a charging circuit comprising a plurality of first transistors and an output circuit comprising a plurality of second transistors, comprising: (a) controlling at least one of the first transistors to turn on and the second transistors to turn off such that the charging circuit charges a target device to a predetermined voltage; (b) controlling at least one of the first transistors and at least one of the second transistors to simultaneously turn on for a predetermined time, after the step (a); and (c) controlling at least one of the second transistors to turn on and the first transistors to turn off, after the step (b).

In view of above-mentioned embodiments, not only the unlocking problem in the prior art can be avoided, but also the total transconductance of the amplifying circuit can be maintained at a relatively stable value or range, thereby increasing the stability of the circuit.

These and other objectives of the present invention will no doubt become obvious to those of ordinary skill in the art after reading the following detailed description of the preferred embodiment that is illustrated in the various figures and drawings.

DETAILED DESCRIPTION

Different embodiments are provided in following descriptions to explain the concept of the present invention. Please note, the term "first", "second", "third" in following descriptions are only for explaining different components or different steps, but do not mean the sequence thereof. Additionally, in following embodiments, if the transistors or the switches turn on, it means the transistors or the switches are conducted. Oppositely, if the transistors or the switches turn off, it means the transistors or the switches are non-conducted.

Figure 1:
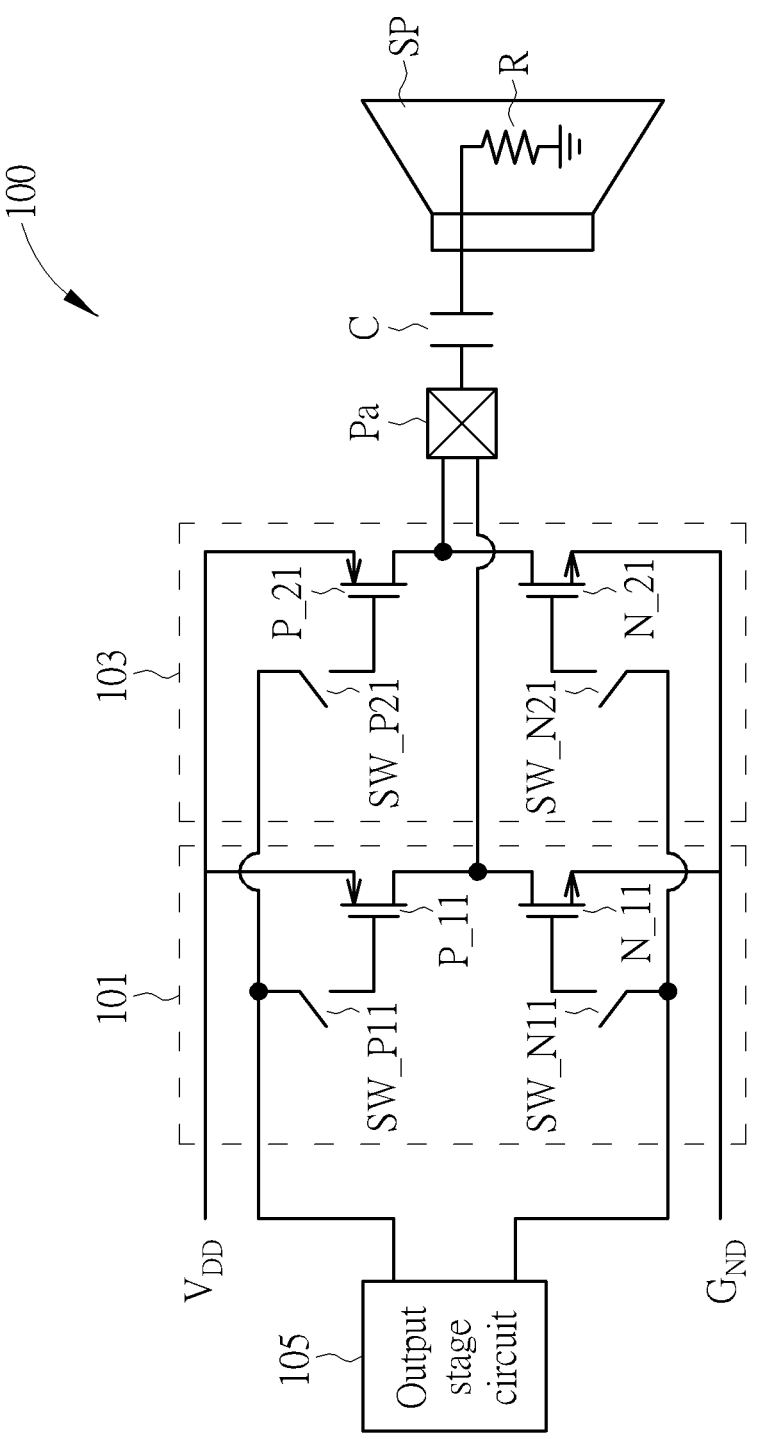
FIG. 1, FIG. 2, FIG. 3 and FIG. 4 are schematic diagrams illustrating the operations of an amplifying circuit in different states, according to embodiments of the present invention.

FIG. 1, FIG. 2, FIG. 3 and FIG. 4 are schematic diagrams illustrating the operations of an amplifying circuit in different states, according to embodiments of the present invention. As shown in FIG. 1, the amplifying circuit 100 comprises a charging circuit 101 and an output circuit 103. In the embodiment of FIG. 1, the charging circuit 101 and the output circuit 103 are both class AB amplifiers. Therefore, the charging circuit 101 comprises a PMOS P_11, an NMOS N_11 and the corresponding switches SW_P11 and SW_N11. Also, the output circuit 103 comprises a PMOS P_21, an NMOS N_21 and the corresponding switches SW_P21 and SW_N21. PMOS P_11 and NMOS N_11 are connected in series, and PMOS P_21 and NMOS N_21 are connected in series.

The switches SW_P11, SW_N11, switches SW_P21 and SW_N21 can be controlled by a control circuit (not shown). For example, the control circuit can generate digital control codes to control the switches SW_P11, SW_N11, switches SW_P21 and SW_N21. The charging circuit 101 and the output circuit 103 are both electrically coupled to a capacitor C through a pad Pa. The capacitor C and the speaker SP form a high pass filter, and the resistor R is the internal equivalent resistance of the speaker SP. In the embodiment of FIG. 1, the speaker SP and the amplifying circuit 100 are not activated, so the switches SW_P11 and SW_N11 turn off, and the PMOS P_11 and NMOS N_11 also turn off. Likewise, the switches SW_P21 and SW_N21 turn off, and the PMOS P_21 and NMOS N_21 turn off. The amplifying circuit 100 may further comprise an output stage circuit 105. The output stage circuit 105 is one of the stages of a multi-stage amplifier, and is used to provide a voltage to the corresponding PMOS or NMOS through the turned on switch when at least one of the switches SW_P11, SW_N11, SW_P21 and SW_N21 turns on.

Figure 2:
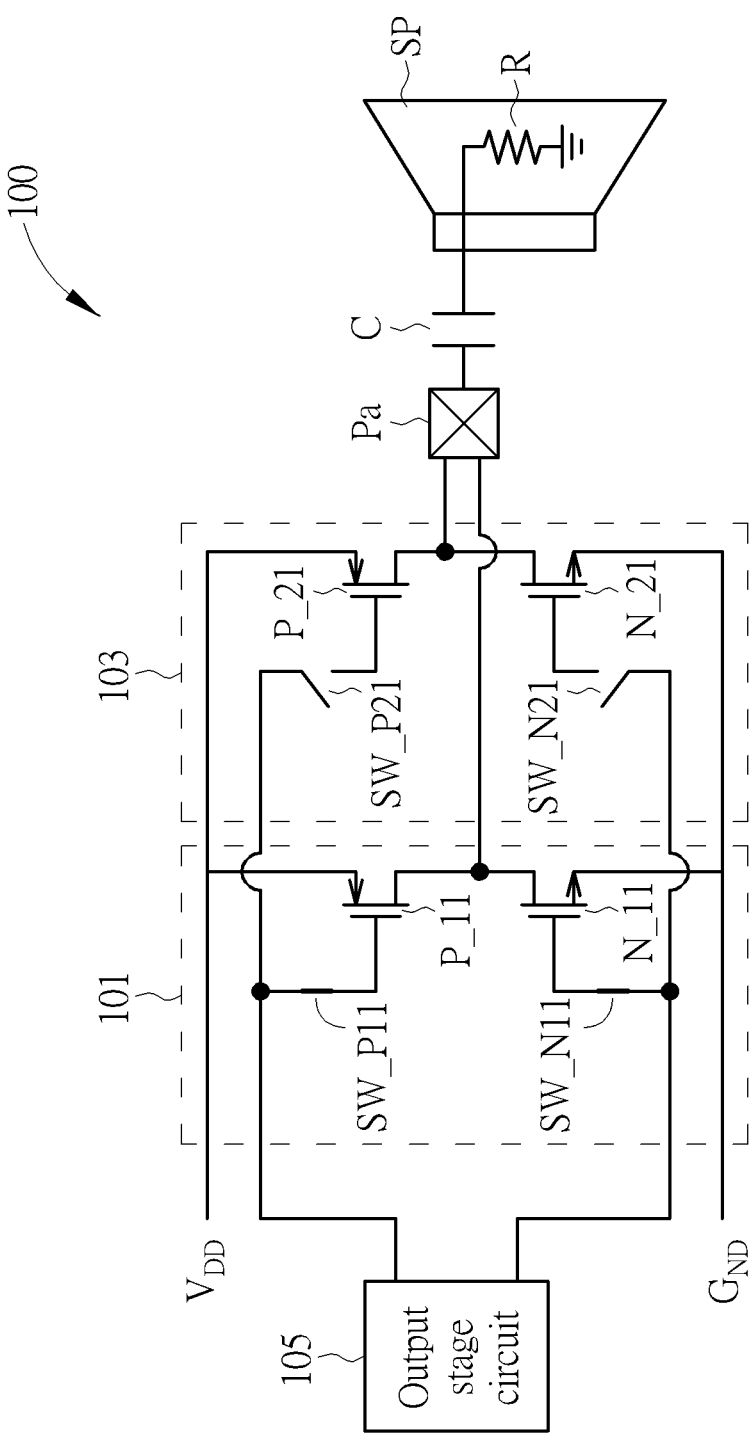

In the embodiment of FIG. 2, the switches SW_P11 and SW_N11 both turn on, so the PMOS P_11 and the NMOS N_11 also turn on correspondingly. Further, the switches SW_P21 and SW_N21 turn off, so the PMOS P_21 and the NMOS N_21 also turn off correspondingly.

In such case, the charging circuit 101 charges the capacitor C so that the voltage of the capacitor C reaches a

Figure 3:
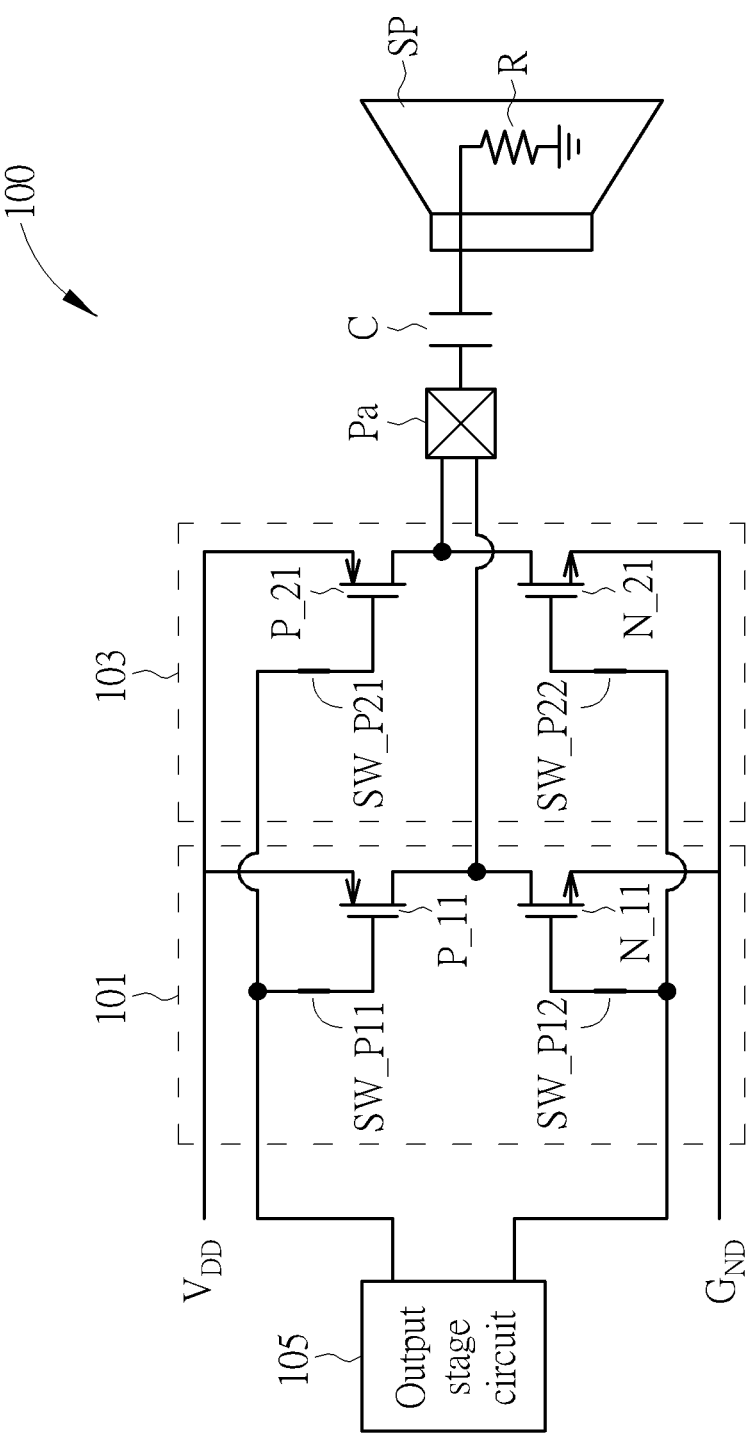
Figure 4:
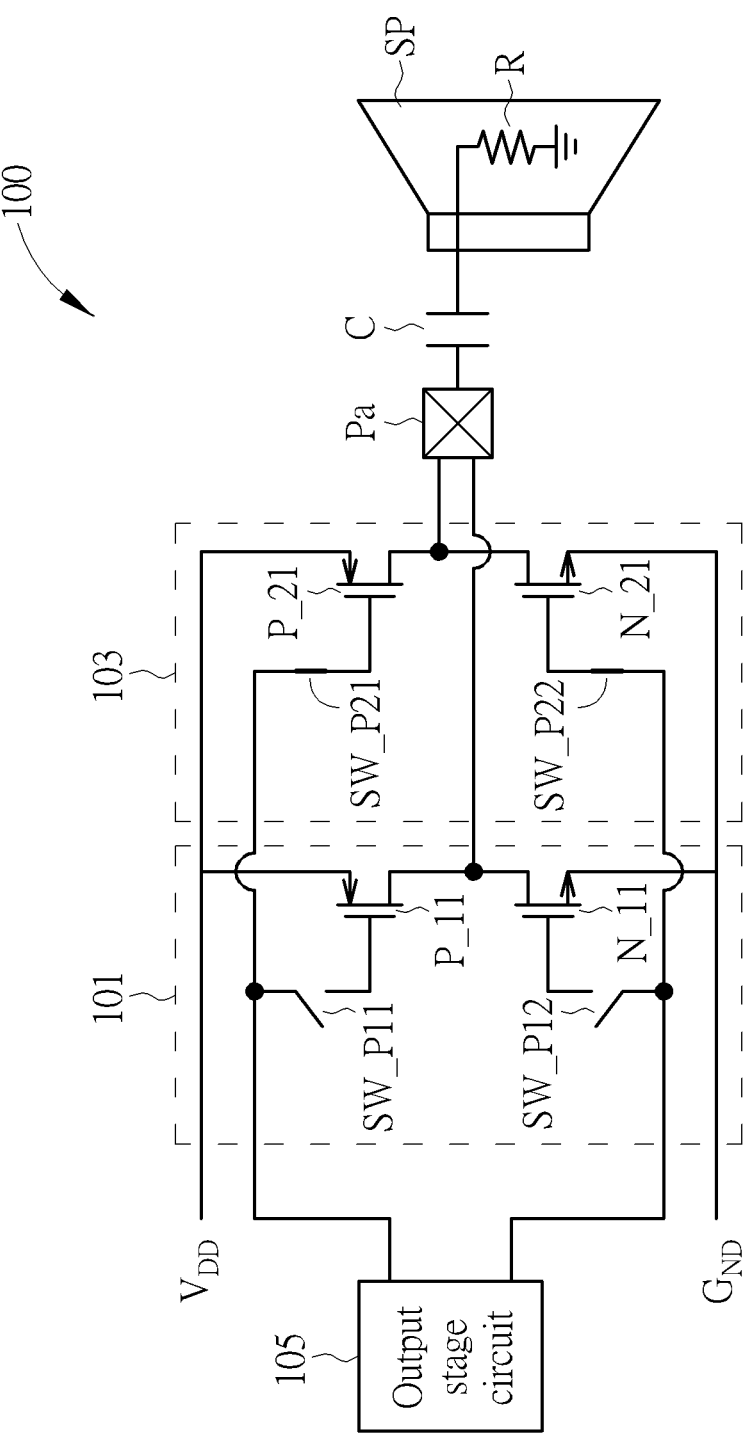

3 predetermined voltage. Then, the amplifying circuit 100 is switched to the state shown in FIG. 3. In the embodiment of FIG. 3, the switches SW_P11, SW_N11, SW_P21 and SW_N21 all turn on, so PMOS P_11, NMOS N_11, PMOS P_21, and NMOS N_21 all turn on correspondingly. The state of FIG. 3 lasts for a predetermined time, and then switches to the state of FIG. 4. The predetermined time can be set according to different circuit design requirements. In the embodiment of FIG. 4, the switches SW_P11 and SW_N11 both turn off, so the PMOS P_11 and NMOS N_11 turn off correspondingly. Additionally, the switches SW_P21 and SW_N21 both turn on, so the PMOS P_21 and NMOS N_21 both turn on correspondingly. In the state of FIG. 4, the PMOS P_21 and the NMOS N_21 can generate the currents required by the speaker SP according to the voltage provided by the output stage circuit 105.

In short, in the state of FIG. 1, the amplifying circuit 100 is in an inactive state, and in the state of FIG. 2, the amplifying circuit 100 is in a charging state in which the capacitor C is charged. In the state shown in FIG. 3, the amplifying circuit 100 is in a "forced to be conducted" state, and the NMOS and PMOS in the charging circuit 101 and the output circuit 103 both turn on. In the state of FIG. 4, the amplifying circuit 100 is in a normal state, that is, the voltage or current required for the speaker SP is supplied. According to the embodiments of FIG. 1, FIG. 2, FIG. 3 and FIG. 4, the NMOSs and PMOSs in the charging circuit 101 and the output circuit 103 do not simultaneously turn on when the speaker SP is active, so the "unlocking problem" in the prior art can be avoided.

As mentioned above, in the embodiment of FIG. 3, the NMOS and PMOS in the charging circuit 101 and the output circuit 103 both turn on. Therefore, in the following embodiments, a method for controlling the transconductance formed by the charging circuit 101 and the output circuit 103 in the state of FIG. 3 is further provided.

Figure 5:
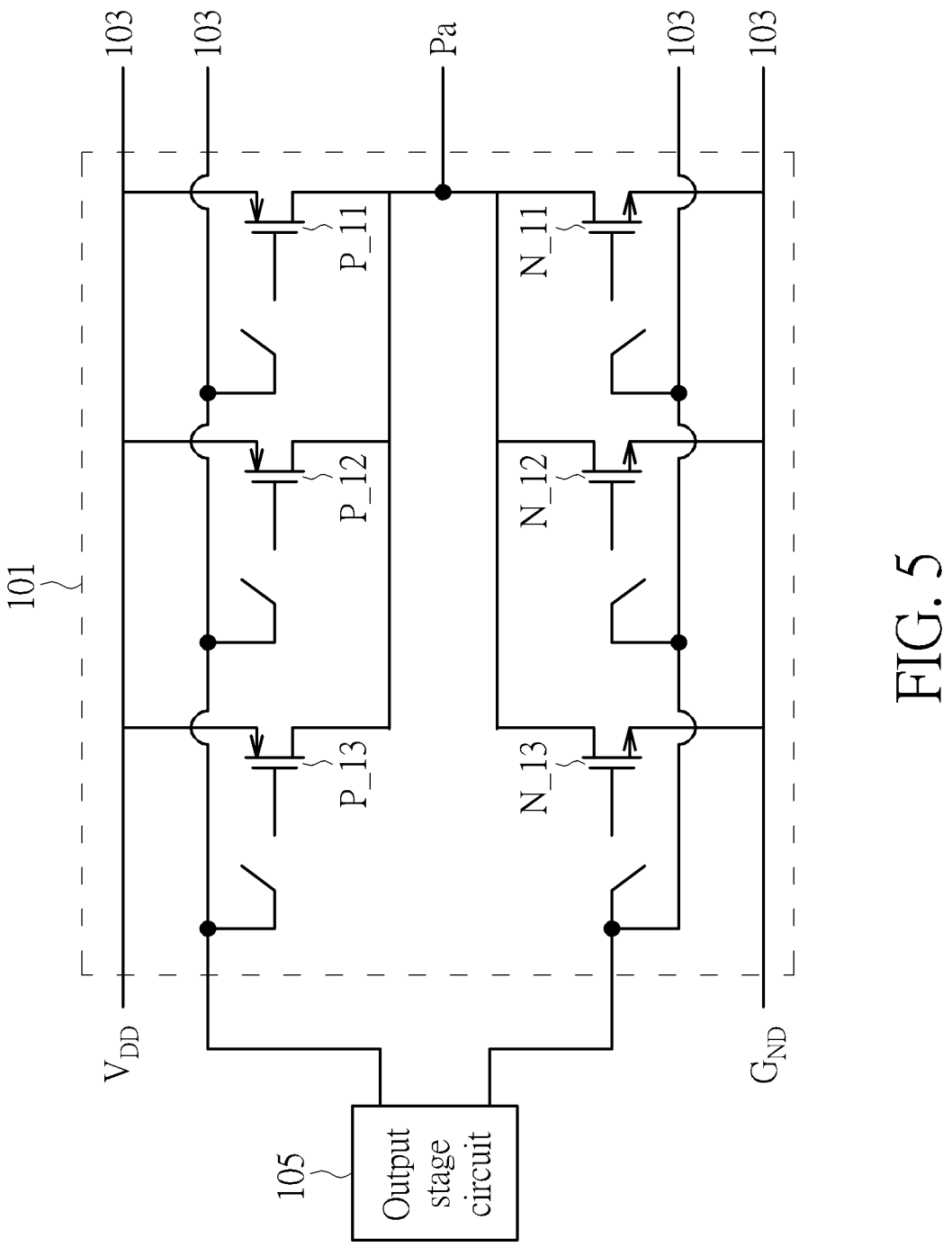
FIG. 5 is a circuit diagram of an amplifying circuit according to another embodiment of the present invention.
Figure 6:
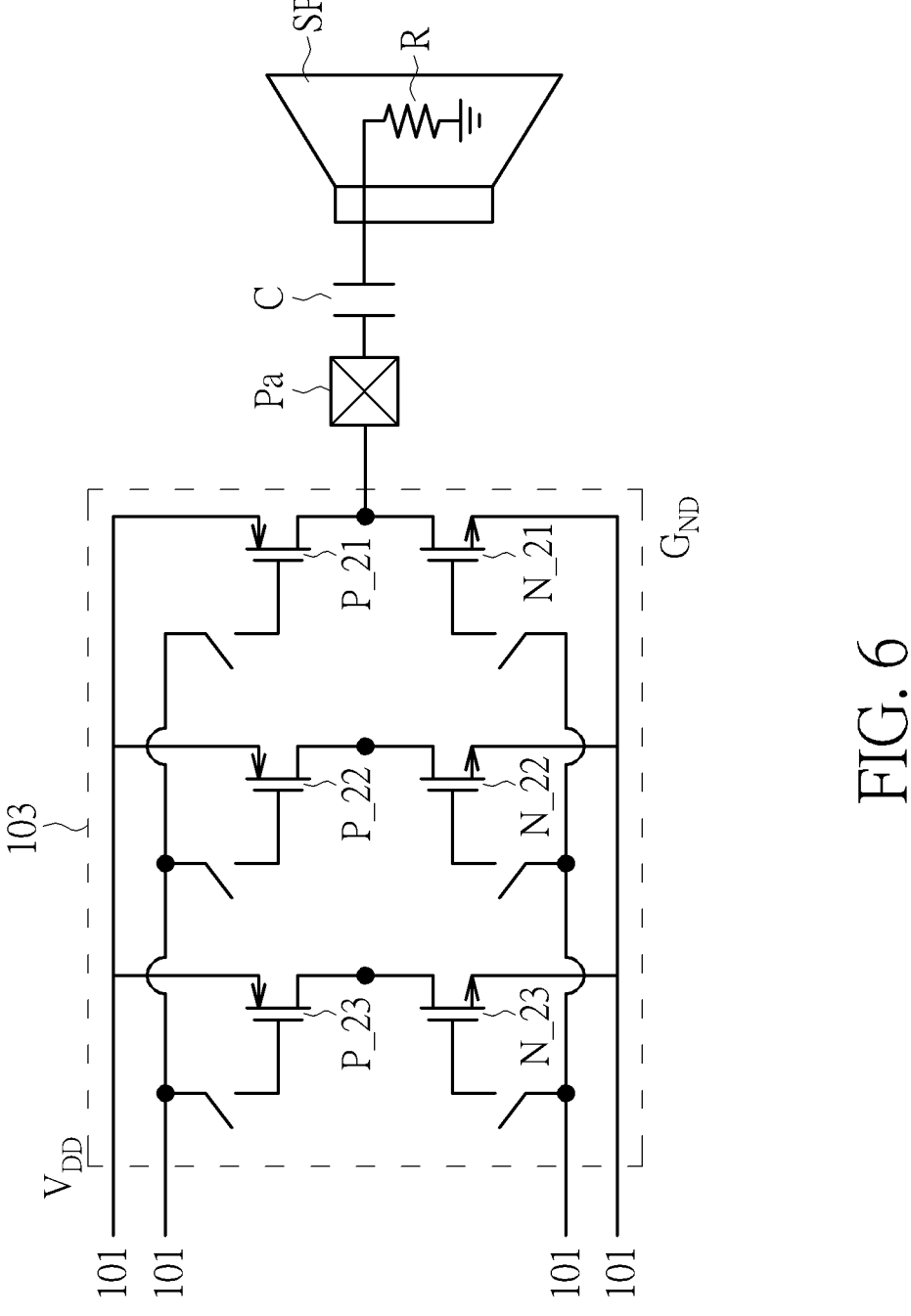
FIG. 6 is a schematic diagram illustrating a layout of transistors of an amplifying circuit, according to one embodiment of the present invention.

In one embodiment, within a predetermined time, the transconductance of the charging circuit 101 gradually decreases, and the transconductance of the output circuit 103 gradually increases, so that the total transconductance of the charging circuit 101 and the output circuit 103 falls in a predetermined range. Please refer to FIG. 5, which shows a circuit diagram of an amplifying circuit according to another embodiment of the present invention. Please also note that in the embodiment of FIG. 5, in order to simplify the illustration, only the structure of the charging circuit 101 is shown, but the output circuit 103 may also have the same structure. As shown in FIG. 5, the charging circuit 101 comprises a plurality of PMOSs P_11, P_12, P13 . . . (only shown but not limited to 3 PMOSs), a plurality of NMOSs N_11, N_12, N_13 (only shown but not limited to 3 NMOSs), and also comprises the corresponding switches. The connections between the PMOS P_11, NMOS N_11 and the output circuit 103 in FIG. 5 may be the same as which in the embodiments of FIGS. 1, FIG. 2, FIG. 3, and FIG. 4. Similarly, the output circuit 103 in FIG. 6 comprises a plurality of PMOSs P_21, P_22, P_23 . . . (only shown but not limited to 3 PMOSs), a plurality of NMOSs N_21, N_22, N_23 (only shown but not limited to 3 NMOSs), and the corresponding switches. Please also note that in the embodiments of FIG. 5 and FIG. 6, the PMOSs are connected in parallel, and the NMOSs connect in parallel as well. However, in other embodiments, the PMOSs may connect in series, and the plurality of NMOSs may connect in series as well.

In one embodiment, the sizes of the NMOSs and PMOSs in the output circuit 103 are larger than the sizes of the NMOS and PMOS in the charging circuit 101. In such case, within a predetermined time in the state of FIG. 3, the number of NMOS or PMOS in the output circuit 103 which initially turn on is a first number, and the number of NMOSs and PMOSs in the charging circuit 101 which initially turns on is a second number. Also, within a predetermined time, the number of turned on NMOSs or PMOSs in output circuit 103 gradually decreases from the first number and the number of turned NMOSs and PMOSs in the charging circuit 101 gradually increases from the second number.

The following Table 1 shows an example corresponding to the embodiment of FIG. 5.

TABLE 1

| State | Transconductance provided by 101 | Transconductance provided by 103 | Total transconductance |
|---|---|---|---|
| FIG. 2 | 1 | 0 | 1 |
| FIG. 3 | 1 | 0.25 | 1.25 |
| | 0.75 | 0.25 | 1 |
| | 0.75 | 0.5 | 1.25 |
| | 0.5 | 0.5 | 1 |
| | 0.5 | 0.75 | 1.25 |
| | 0.25 | 0.75 | 1 |
| | 0.25 | 1 | 1.25 |
| FIG. 4 | 0 | 1 | 1 |

Please also note that the numbers in Table 1 are only for illustrating the relationships of the transconductance under different states, not the real transconductance value. As shown in Table 1, in the state of FIG. 2, since both the NMOS and PMOS in the charging circuit 101 turn on and the NMOS and PMOS in the output circuit 103 turn off, the transconductance provided by the charging circuit 101 is 1, the transconductance provided by the output circuit 103 is 0, and the total transconductance is 1. However, in the state of FIG. 3, the number of the turned NMOSs or PMOSs in the charging circuit 101 gradually decreases from the initial number (all MOSs turn on), so the transconductance provided by the charging circuit 101 also gradually decreases. On the contrary, the turned number of the NMOSs or PMOSs in the output circuit 103 gradually increases from the initial number 0, so the transconductance provided by the NMOSs or PMOSs also gradually increases. In the embodiment of FIG. 3, the total transconductance is maintained at 1 or 1.25, that is, maintained at one of a plurality of fixed values. However, the methods provided in FIG. 5 and Table 1 can also be used to maintain the total transconductance within a predetermined range.

For more detail, the transconductance of PMOSs or NMOSs can be determined by the following Equation 1.

$$gm_n = u_n c_{ox} \frac{w}{L} (V_{GS} - V_T) \qquad \text{Equation 1}$$

In Equation 1, VGS is provided by the output stage circuit. Also, VT, un, and Cox are the characteristic parameters of the MOS itself. Therefore, the transconductance can be determined by adjusting W/L (equivalent to the number of turned on MOSS).

Various methods can be used to adjust the amount of NMOS or PMOS conduction. In one embodiment, the adjustment is performed by changing a conducted matrix size of a layout corresponding to the NMOSs or PMOSs.

The above-mentioned embodiments are described by taking the class AB amplifier circuit used in the speaker as an example, but the concept of the present invention can be used in circuits other than the class AB amplifier circuit and is not limited to be used in the speaker. Therefore, the amplifying circuit disclosed in the present invention can be simplified as: an amplifying circuit, comprising: a charging circuit (e.g., the charging circuit 101), comprising a plurality of first transistors electrically coupled to a target device (e.g., the capacitor C in FIG. 4); and an output circuit (e.g., the output circuit 103), comprising a plurality of second transistors electrically coupled to the target device. After at least one of the first transistors turns on and the second transistors turn off such that the charging circuit charges the target device to a predetermined voltage (e.g., the state of FIG. 2), at least one of the first transistors and at least one of the second transistors simultaneously turn on for a predetermined time (e.g., the state of FIG. 3), and then at least one of the second transistors turns on but the first transistors turns off (e.g., the state of FIG. 4). The first transistor and the second transistor can be PMOS or NMOS, corresponding to the type of the amplifying circuit.

Other details about the first transistor and the second transistor have been disclosed in the above-mentioned embodiments, thus descriptions thereof are omitted for brevity here.

Figure 7:
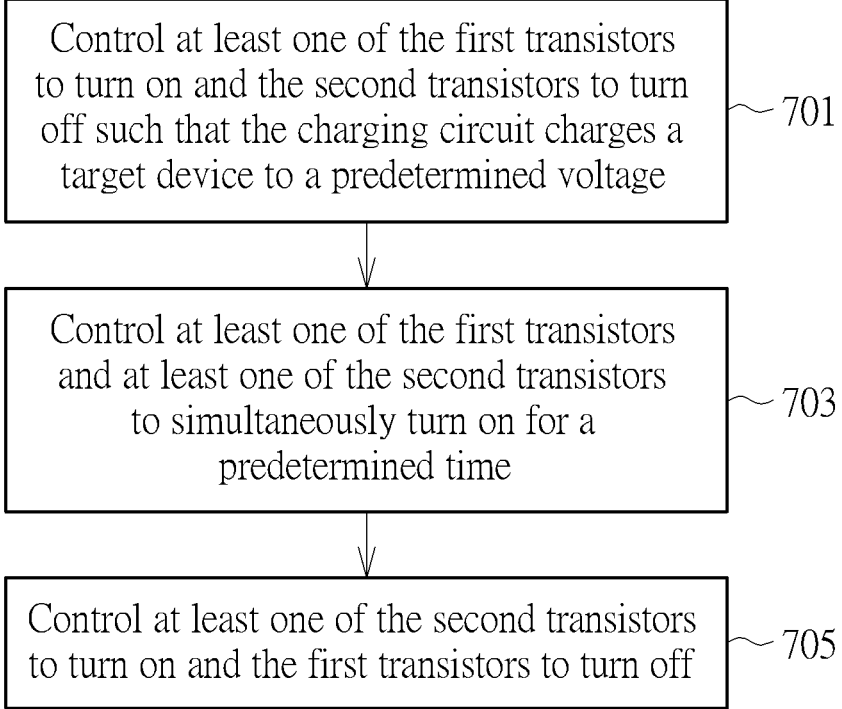
FIG. 7 is a flow chart illustrating a charging method, according to one embodiment of the present invention.

In view of above-mentioned embodiments, the charging method shown in FIG. 7 can be acquired, which is used in a charging circuit comprising a plurality of first transistors and an output circuit comprising a plurality of second transistors. The charging method comprises following steps:

Step 701

Control at least one of the first transistors to turn on and the second transistors to turn off such that the charging circuit charges a target device to a predetermined voltage (e.g., the state of FIG. 2).

Step 703

Control at least one of the first transistors and at least one of the second transistors to simultaneously turn on for a predetermined time, after the step 701 (e.g., the state of FIG. 3).

Step 705

Control at least one of the second transistors to turn on and the first transistors to turn off, after the step 703 (e.g., the state of FIG. 3).

In view of above-mentioned embodiments, not only the unlocking problem in the prior art can be avoided, but also the total transconductance of the amplifying circuit can be maintained at a relatively stable value or range, thereby increasing the stability of the circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifying circuit adapted for electrically coupling to a target device, the amplifying circuit comprising:

a charging circuit, comprising a plurality of first transistors electrically coupled to the target device; and an output circuit, comprising a plurality of second transistors electrically coupled to the target device;

wherein after at least one of the first transistors turns on and the second transistors turn off such that the charging circuit charges the target device to a predetermined voltage, at least one of the first transistors and at least one of the second transistors simultaneously turn on for a predetermined time, and then at least one of the second transistors turns on while the first transistors turns off;

wherein the output circuit is a class AB amplifier.

2. The amplifying circuit of claim 1, wherein transconductance of the charging circuit gradually decreases and transconductance of the output circuit gradually increases in the predetermined time, thereby a total transconductance of the charging circuit and the output circuit falls in a predetermined range.

3. The amplifying circuit of claim 2, wherein sizes of the second transistors are larger than sizes of the first transistors;

wherein a number of the first transistors which initially turn on in the predetermined time is a first number, and a number of the second transistors which initially turn on in the predetermined time is a second number;

wherein a number of the first transistors which turn on gradually decreases from the first number in the predetermined time and a number of the second transistors which turn on gradually increases from the second number in the predetermined time.

4. The amplifying circuit of claim 3, wherein the step of changing the number of the first transistors which turn on and the number of the second transistors which turn on is implemented by:

changing a conducted matrix size of a layout corresponding to the first transistors or the second transistors.

5. The amplifying circuit of claim 1, wherein the target device is a capacitor between a pad and a speaker, wherein the charging circuit and the output circuit are electrically coupled to the capacitor via the pad.

6. The amplifying circuit of claim 1, wherein the first transistors and the second transistors are connected in series.

7. A charging method, applied to a charging circuit comprising a plurality of first transistors and an output circuit comprising a plurality of second transistors, comprising:

(a) controlling at least one of the first transistors to turn on and the second transistors to turn off such that the charging circuit charges a target device to a predetermined voltage;

(b) controlling at least one of the first transistors and at least one of the second transistors to simultaneously turn on for a predetermined time, after the step (a); and (c) controlling at least one of the second transistors to turn on and the first transistors to turn off, after the step (b);

wherein the output circuit is a class AB amplifier.

8. The charging method of claim 7, further comprising:

controlling transconductance of the charging circuit to gradually decrease and transconductance of the output circuit to gradually increase in the predetermined time, thereby a total transconductance of the charging circuit and the output circuit falls in a predetermined range.

9. The charging method of claim 8, wherein sizes of the second transistors are larger than sizes of the first transistors, wherein the charging method further comprises:

controlling a first number of the first transistors to initially turn on in the predetermined time, and controlling a second number of the second transistors to initially turn on in the predetermined time;

gradually decreasing a number of the first transistors which turn on from the first number in the predetermined time and gradually increasing a number of the second transistors which turn on from the second number in the predetermined time.

10. The charging method of claim 9, wherein the step of changing the number of the first transistors which turn on and the number of the second transistors which turn on is implemented by:

changing a conducted matrix size of a layout corresponding to the first transistors or the second transistors.

11. The charging method of claim 7, wherein the target device is a capacitor between a pad and a speaker, wherein the charging circuit and the output circuit are electrically coupled to the capacitor via the pad.

12. The charging method of claim 7, wherein the first transistors and the second transistors are connected in series.

\* \* \* \* \*